United States Patent
Palaniswamy et al.

(10) Patent No.: US 9,179,543 B2
(45) Date of Patent: Nov. 3, 2015

(54) FLEXIBLE LED DEVICE WITH WIRE BOND FREE DIE

(75) Inventors: Ravi Palaniswamy, Singapore (SG); Arokiaraj Jesudoss, Singapore (SG); Alejandro Aldrin Il Agcaoili Narag, Singapore (SG); Siang Sin Foo, Singapore (SG); Fong Liang Tan, Singapore (SG); Andrew J. Ouderkirk, St. Paul, MN (US); Justine A. Mooney, Austin, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 13/881,466

(22) PCT Filed: Oct. 27, 2011

(86) PCT No.: PCT/US2011/057975
§ 371 (c)(1),
(2), (4) Date: Apr. 25, 2013

(87) PCT Pub. No.: WO2012/061182
PCT Pub. Date: May 10, 2012

(65) Prior Publication Data
US 2013/0213697 A1 Aug. 22, 2013

Related U.S. Application Data

(60) Provisional application No. 61/409,801, filed on Nov. 3, 2010, provisional application No. 61/409,796, filed on Nov. 3, 2010, provisional application No. 61/444,374, filed on Feb. 18, 2011, provisional
(Continued)

(51) Int. Cl.
*H05K 1/02* (2006.01)
*H01L 33/48* (2010.01)
(Continued)

(52) U.S. Cl.
CPC .............. *H05K 1/0277* (2013.01); *H01L 24/17* (2013.01); *H01L 33/486* (2013.01); *H05K 1/0203* (2013.01); *H05K 1/189* (2013.01); *H01L 33/64* (2013.01); *H01L 2924/01029* (2013.01); *H01L 2924/01322* (2013.01);
(Continued)

(58) Field of Classification Search
CPC ... H05K 1/0277; H05K 1/0278; H05K 1/028; H05K 1/0281; H05K 1/0283
USPC .................................................. 361/761–764
See application file for complete search history.

(56) References Cited

U.S. PATENT DOCUMENTS 4,994,938 A * 2/1991 Baudouin ...................... 361/761
6,153,928 A * 11/2000 Cho .............................. 257/686
(Continued)

FOREIGN PATENT DOCUMENTS

CN 1825640 8/2006
EP 0 338 641 A1 10/1989
(Continued)

*Primary Examiner* — Jeremy C Norris
(74) *Attorney, Agent, or Firm* — Clifton F. Richardson

(57) ABSTRACT

An article includes a flexible polymeric dielectric layer having first and second major surfaces. The first major surface has a conductive layer thereon and at least one cavity therein. The at least one cavity contains a conductive material including electrically separated first and second portions supporting and electrically connecting a light emitting semiconductor device to the conductive layer on the first major surface.

5 Claims, 3 Drawing Sheets

Related U.S. Application Data application No. 61/444,370, filed on Feb. 18, 2011, provisional application No. 61/477,231, filed on Apr. 20, 2011, provisional application No. 61/496,289, filed on Jun. 13, 2011, provisional application No. 61/524,646, filed on Aug. 17, 2011, provisional application No. 61/524,660, filed on Aug. 17, 2011, provisional application No. 61/524,649, filed on Aug. 17, 2011.

(51) Int. Cl.
*H01L 23/00* (2006.01)
*H01L 33/64* (2010.01)
*H05K 1/18* (2006.01)

(52) U.S. Cl.
CPC ........ *H01L 2924/01327* (2013.01); *H01L 2924/07802* (2013.01); *H01L 2924/12032* (2013.01); *H01L 2924/12041* (2013.01); *H01L 2924/1461* (2013.01); *H01L 2924/351* (2013.01); *H05K 1/183* (2013.01); *H05K 2201/10106* (2013.01); *H05K 2201/2054* (2013.01)

(56) References Cited

U.S. PATENT DOCUMENTS

| | | | |
|---|---|---|---|
| 6,297,598 B1 | 10/2001 | Wang | |
| 6,320,753 B1 * | 11/2001 | Launay | 361/760 |
| 6,412,971 B1 * | 7/2002 | Wojnarowski et al. | 362/241 |
| 6,531,328 B1 | 3/2003 | Chen | |
| 7,199,400 B2 | 4/2007 | Sasuga | |
| 7,348,045 B2 | 3/2008 | Yang | |
| 7,354,846 B2 | 4/2008 | Kim | |
| 7,714,341 B2 | 5/2010 | Chil Keun | |
| 7,745,832 B2 | 6/2010 | Hsieh | |
| 7,763,895 B2 | 7/2010 | Hsiao | |
| 7,816,156 B2 | 10/2010 | Choi | |
| 7,872,277 B2 | 1/2011 | Hsu | |
| 8,101,966 B2 | 1/2012 | Yen | |
| 2005/0116235 A1 | 6/2005 | Schultz | |
| 2005/0247944 A1 | 11/2005 | Haque | |
| 2006/0087866 A1 | 4/2006 | Ng | |
| 2006/0171152 A1 | 8/2006 | Suehiro | |
| 2006/0186430 A1 | 8/2006 | Park | |
| 2007/0029569 A1 | 2/2007 | Andrews | |
| 2007/0096272 A1 | 5/2007 | Wang | |
| 2007/0120089 A1 | 5/2007 | Mao | |
| 2007/0253209 A1 | 11/2007 | Loh et al. | |
| 2008/0057333 A1 | 3/2008 | Chu et al. | |
| 2008/0067526 A1 | 3/2008 | Chew | |
| 2008/0101071 A1 | 5/2008 | Imai | |
| 2009/0121249 A1 | 5/2009 | Tseng et al. | |
| 2009/0137073 A1 | 5/2009 | Park | |
| 2009/0321778 A1 | 12/2009 | Chen | |
| 2010/0096746 A1 | 4/2010 | Tseng | |
| 2010/0109030 A1 | 5/2010 | Krames | |
| 2010/0148185 A1 | 6/2010 | Hsu | |
| 2010/0155696 A1 * | 6/2010 | Duan et al. | 257/14 |
| 2010/0155746 A1 | 6/2010 | Ibbetson | |
| 2010/0163897 A1 | 7/2010 | Hsiao | |
| 2010/0165601 A1 | 7/2010 | Yoon | |
| 2010/0252840 A1 | 10/2010 | Ibbetson | |
| 2010/0301493 A1 | 12/2010 | Gallegos | |
| 2011/0007509 A1 | 1/2011 | Hayes | |
| 2011/0084294 A1 | 4/2011 | Yao | |

FOREIGN PATENT DOCUMENTS

| | | |
|---|---|---|
| EP | 1 744 376 A2 | 1/2007 |
| FR | 2 934 916 A1 | 2/2010 |
| JP | 2010-251376 | 11/2010 |
| TW | 200709471 | 3/2007 |
| WO | WO 2007/001995 A1 | 1/2007 |
| WO | WO 2007/089599 A2 | 8/2007 |
| WO | WO 2012/061010 A2 | 5/2012 |
| WO | WO 2012/061182 A1 | 5/2012 |
| WO | WO 2012/061183 A2 | 5/2012 |
| WO | WO 2012/061184 A1 | 5/2012 |
| WO | WO 2012/112310 A1 | 8/2012 |
| WO | WO 2012/112666 A2 | 8/2012 |
| WO | WO 2012/112873 A2 | 8/2012 |
| WO | WO 2013/025402 A2 | 2/2013 |

\* cited by examiner

FLEXIBLE LED DEVICE WITH WIRE BOND FREE DIE

TECHNICAL FIELD

This invention relates to flexible high power light emitting semiconductor devices.

BACKGROUND

Conventional light emitting semi-conductor (LES) devices (LESDs), including light emitting diodes (LEDs) and laser diodes, and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by a buildup of heat generated from within the devices, as well as heat from sunlight in the case of outside lighting applications. Excessive heat buildup can cause deterioration of the materials used in the LES devices, such as encapsulants for the LESDs. When LESDs are attached to flexible-circuit laminates, which may also include other electrical components, the heat dissipation problems are greatly increased.

Additionally, conventional LES devices and packages tend to be thick, which limits their uses in low form factor applications. Consequently, there is a continuing need to improve the design of flexible LES devices and packages to improve their thermal dissipation properties, as well as to allow for their use in low form factors.

SUMMARY

At least one aspect of the present invention provides a cost-effective thermal management solution for current and future high power LESD constructions through a robust flexible LESD construction. The ability to dissipate large amounts of heat is needed for the operation of high power LESD arrays. According to at least one embodiment of the present invention, heat dissipation can be managed by integrating the LESDs into a system having a flexible polymeric dielectric substrate, i.e., a dielectric layer. To accomplish better heat management, LESDs are positioned so they are in close or direct thermal contact with thermally conductive layers by controlling the thickness of, the insulator (dielectric) material between the LESD and a thermally conductive layer or by completely removing the insulator material between the LESD and a thermally conductive layer. In at least one embodiment of the present invention, to achieve the desired positioning of the LESD controlled removal, e.g., by etching, of the dielectric substrate to a desired thickness to form a cavity, or creating an opening completely through the dielectric substrate to form a via, is performed. Etching of the dielectric substrate may provide additional advantages by creating slanted side walls which can be coated with a reflecting material to provide enhanced light efficiency. Additionally, in at least some embodiments, because the LESD sits below the surface of the dielectric substrate, it has a lower profile than standard LES devices, which makes it well-suited for low form factor applications.

At least one aspect of the present invention features an article comprising a flexible polymeric dielectric layer having first and second major surfaces. The first major surface has a conductive layer thereon and at least one cavity therein. The at least one cavity contains a conductive material including electrically separated first and second portions configured to support and electrically connect a light emitting semiconductor device to the conductive layer on the first major surface.

At least one aspect of the present invention features an article comprising a flexible polymeric dielectric layer having first and second major surfaces. The first and second major surfaces each have a conductive layer thereon. The dielectric layer has at least one via extending from the first major surface to the second major surface. The at least one via contains a conductive material electrically connected to the conductive layer on the second major surface and including electrically separated first and second portions configured to support and electrically connect a light emitting semiconductor device to the conductive layer on the first major surface.

At least one aspect of the present invention features an article comprising a flexible polymeric dielectric layer having a first major surface with a first conductive layer thereon and having a second major surface with a second conductive layer thereon. The dielectric layer has at least one cavity, or via, extending from the first major surface toward, or to, the second major surface. The first conductive layer extends into the at least one cavity, or via. The at least one cavity, or via, contains a conductive feature and two conductive pads. The conductive pads are electrically insulated from each other and from the conductive feature.

As used in this application:

"LES" means light emitting semiconductor(s), including light emitting diode(s) and laser diode(s) and "LESD" means light emitting semiconductor device(s), including light emitting diode device(s) and laser diode device(s). An LESD may be a bare LES die construction, a complete packaged LES construction, or an intermediate LES construction comprising more than the bare die, but less than all the components for a complete LES package, such that the terms LES and LESD may be used interchangeably and refer to one or all of the different LES constructions. The term "flexible LES device" or "flexible LESD" typically refers to the flexible article containing the bare die light emitting semiconductor, packaged LES construction, or intermediate LES construction.

An advantage of at least one embodiment of the present invention is that the LESD's major light emitting surface may be well confined within the cavity or via, which may improve the light output of the device. Another advantage of at least one embodiment of the present invention is that the light reflection may be improved by reflective coatings on the cavity or via side walls. Another advantage of at least one embodiment of the present invention is that the cavity or via contains the encapsulant filling in a confined area. Another advantage of at least one embodiment of the present invention is that the thermal dissipation may be further enhanced in the x-y direction, i.e., the length and width direction of the flexible substrate, by providing a cavity or via having a large surface area and in the z-direction, i.e., the thickness direction, by providing a thinned polymeric dielectric layer between two thermally conductive layers. Another advantage of at least one embodiment of the present invention is that the LESDs on the flexible dielectric substrate may be electrically connected in series, in parallel, or individually depending on the desired application. Another advantage of at least one embodiment of the present invention is that the LESDs may be bonded on a conductive material, enabling the LESDs to be electrically biased without the need for wire bonding. Another advantage of at least one embodiment of the present invention is minimized yield loss in final packaging, overcoming wire bonding issues. Another advantage of at least one embodiment of the present invention is that the thin dielectric layer may be achieved using wet chemistries, excimer laser ablation, mechanical punching, and plasma etching. Another advantage of at least one embodiment of the present invention is that the flexible dielectric substrate facilitates making a circuitry pattern on both sides of the substrate. Another advantage of at least one embodiment of the present invention is that the flexible substrate provides great flexibility and bendability for the LESD articles. Another advantage of at least one embodiment of the present invention is that a thermal interface material (TIM) may be used as an underfill to enhance the thermal performance of the device. Another advantage of at least one embodiment of the present invention is that a direct die attach method for bonding a wire bond free die to the conductive material provides enhanced thermal dissipation because of the relatively large contact area. Another advantage of at least one embodiment of the present invention is that during a laser lift-off process, the flexible dielectric layer of the flexible LESD may act as a stress accommodating layer, which will keep the semiconductor layer of the die intact.

The above summary of the present invention is not intended to describe each disclosed embodiment or every implementation of the present invention. The Figures and detailed description that follow below more particularly exemplify illustrative embodiments.

DETAILED DESCRIPTION

In the following description, reference is made to the accompanying set of drawings that form a part of the description hereof and in which are shown by way of illustration several specific embodiments. In general similar reference numbers are used for similar features in the various embodiments. Unless indicated otherwise, these similar features may comprise the same materials, have the same attributes, and serve the same or similar functions. Additional or optional features described for one embodiment may also be additional or optional features for other embodiments, even if not explicitly stated, where appropriate. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc. In addition, directional terminology, such as "top," "bottom," "front" "back," "above," "below," etc., is used with reference to the orientation of the Figure(s) being described. Because components of embodiments can be positioned in a number of different orientations, the directional terminology is used for purposes of illustration and is in no way limiting.

Figure 1:
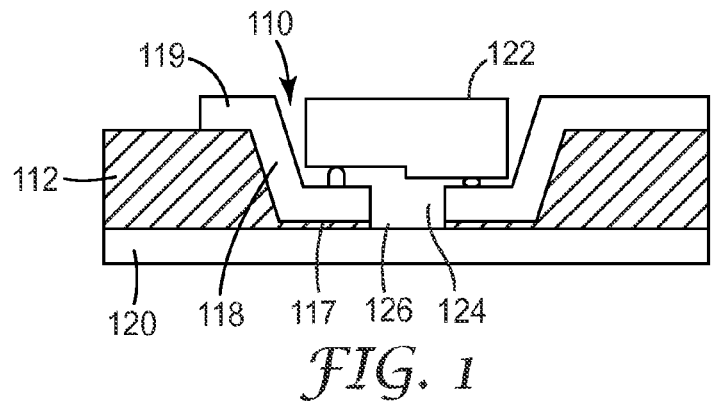
FIG. 1 is a schematic cross-sectional view of an exemplary embodiment of a flexible LESD according to an aspect of the present invention.

At least one embodiment of the present invention is illustrated in FIG. 1, which shows a flexible polymeric dielectric substrate 112 having at least one indentation or cavity 110 in which is located an LESD 122. Cavity 110 is initially defined by walls and floor 117, but may be further defined by layers and coatings applied to its walls and floor 117. (Although the plural term "cavity walls" is used herein, this term also refers to a single continuous curved wall such as those with a conical or frustoconical shape.) LESD 122 is a flip chip die, i.e., the die is "flipped" upside down when it is attached. A flip chip die may be referred to as a type of wire bond free die, which does not use wires to interconnect the chip pads to external circuitry. Flip chip is a method for interconnecting semiconductor devices, such as IC chips and Microelectromechanical systems (MEMS), to external circuitry with solder bumps that have been deposited onto the chip pads. The solder bumps are deposited on the chip cathode and anode pads on the top side of the chip during the final processing step. In order to mount the chip to external circuitry (e.g., a circuit board or another chip or wafer), it is flipped over so that its side with electrical contacts faces down, and aligned so that its pads align with matching pads on the external circuit, and then the solder is flowed to complete the interconnect. This is in contrast to wire bonding, in which the chip is mounted upright and wires are used to interconnect the chip pads to external circuitry. In some embodiments, a flip chip die includes an anode and a cathode that are not on the same plane. Further, bond sites located in cavity 110 for the two LESD contacts need to be electrically isolated from each other. This may be done, for example as is shown in FIG. 1, by creating a gap 124 in the conductive material deposited in the cavity. Gap 124 may be created at the time conductive material is deposited in via 110, e.g., by masking the portion of cavity floor 117 over which gap 124 is desired, or may be created later by removing a portion of conductive material 118, such as by etching or other suitable removal processes. The portion of dielectric substrate 112 forming floor 117 of cavity 110 may also have a gap 126, as shown in FIG. 1, or may be continuous. In FIG. 1, floor 117 is formed by a portion of dielectric substrate 112. The walls and floor of cavity 110 support conductive material 118. In some embodiments, conductive material 118 may support additional layers such as a reflective coating. The reflective coating may be gold, silver, aluminum with enhanced reflectivity, an inherently reflective dielectric material, or a pigmented material. Conductive layer 119 is located on the top surface of dielectric substrate 112 and conductive layer 120 is located on the bottom surface of dielectric substrate 112. In some embodiments, conductive layer 119 comprises an electrically conductive circuit. Conductive material 118 supports LESD 122 in cavity 110. Conductive layer 120 is preferably thermally conductive and optionally electrically conductive. In some embodiments, conductive layer 120 comprises an electrically conductive circuit. Conductive material 118 may comprise a portion of conductive layer 119 that is located in cavity 110, may comprise conductive material other than a portion of conductive layer 119 that is deposited in cavity 110, or may comprise a combination of both. Conductive layer 119 and conductive material other than conductive layer 119 may comprise the same or different matter. For example, both may be copper, or they may be different e.g., conductive layer 119 might be copper while the conductive material may be solder. If conductive layer 119 and the conductive material comprise the same matter, the interface between the two may be obscured. In at least one aspect, conductive layer 119 functions as an electrically conductive layer, while conductive layer 120 functions as a heat sink, facilitating effective heat dissipation from LESD 122. In at least one aspect, cavity 110 may be advantageously used to provide underfill having a substantially uniform and level surface and advantageously used to retain an encapsulant for LESD 122. In at least one aspect, the thickness of conductive layer 119 may be adjusted to accommodate flip chip die bonding, e.g., when the anode and cathode of the flip chip die are not on the same plane. The flip chip die may be bonded by any suitable known method. This height adjustment may be accomplished by removing conductive material from, or adding conductive material to, one bond site in cavity 110. Conductive material may be removed by known methods such as chemical etching, plasma etching, focused ion-beam etching, and laser ablation. Where necessary, the bond pad remaining the same height can be covered with a photomask. Conductive material can be added to one of the bond sites by methods such as electroplating. Again, where necessary, the bond pad (and other conductive surfaces) remaining the same height can be covered with a photomask.

Figure 2:
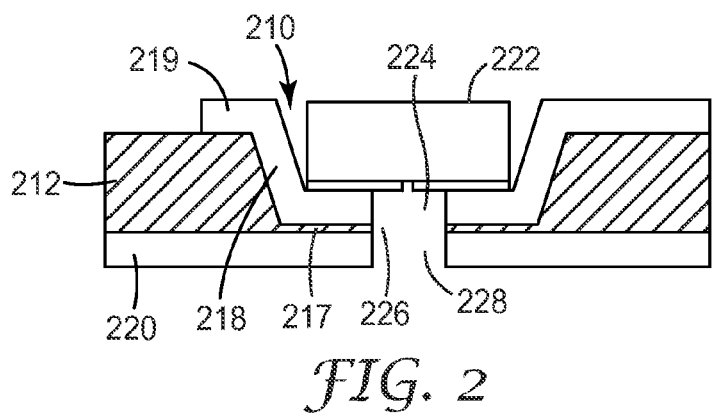
FIG. 2 is a schematic cross-sectional view of another exemplary embodiment of a flexible LESD according to an aspect of the present invention.

At least one embodiment of the present invention is illustrated in FIG. 2, which is substantially similar to the embodiment of FIG. 1 in that it includes a flexible polymeric dielectric substrate 212 having a conductive layer 219 on the top surface thereof and at least one indentation or cavity 210 therein in which is located an LESD 222. Bond sites located in cavity 210 are electrically isolated from each other by gap 224 in the conductive material 218 deposited in the cavity. The portion of dielectric substrate 212 forming cavity floor 217 of cavity 210 also has a gap 226. In this embodiment conductive layer 220 located on the bottom surface of dielectric substrate 212 also has a gap 228. An additional difference is that LESD 222 is a lateral die, i.e., the electrical contacts are on the bottom of the die, and are substantially on the same plane. Similar to a flip chip die, a lateral die may be referred to as a type of wire bond free die, which does not use wires to interconnect the chip pads to external circuitry. In one aspect, whereas in a flip chip die the major emitting surface faces downward, in a lateral die the major emitting surface faces upward. As a result, the use of a reflective coating may be less essential. With respect to bonding, advantages of a lateral die compared with a flip chip die may include that various bonding methods may be used, that the bonding pads are substantially on the same plane, that the bonding pads are on the back side of the LED substrate resulting in no obstruction to emitted light, and the presence of relatively large bond pads for effective heat dissipation. Examples of lateral die configurations that can be used in aspects of the present invention are shown and described in U.S. Patent Publication Nos. 2010/0252840 A1, 2010/0155746 A1, and 2011/0084294 A1. Various methods may be used to bond a lateral die, such as, e.g., flip chip bonding or a direct die attach method. Direct die attach is a method for interconnecting semiconductor devices, such as IC chips and Microelectromechanical systems (MEMS), to external circuitry using, e.g., eutectic, conductive paste, or solder to directly bond and electrically connect the die to the substrate. This is in contrast to wire bonding, in which wires are used to interconnect the chip pads to external circuitry. An example of direct die attach includes gold-tin eutectic die attachment. For gold-tin eutectic die attachment, there are currently two possible approaches, namely flux eutectic die attach and direct eutectic die attach. During flux eutectic die attachment, a small volume of flux is placed on the package substrate, and the LESD is placed onto the flux. After that, the substrate with the LESD mounted on it will be put into the reflow oven to complete the bonding. There is no external force applied throughout the process. Direct eutectic die attach involves preheating the substrate to 300-320° C. in an ambient chamber with shielding gas, then an LESD is picked by a bond head collet and placed onto the heated substrate with a compression force. After a certain time (about 100 to 200 ms), the contact force is released. Initially in this process, the gold-tin eutectic layer will be in a molten state on the substrate. After the substrate bond pad materials (gold, silver, palladium, etc.) dissolve into the molten gold-tin layer, and reach the saturation limit at this temperature, solidification will occur due to the high melting point of the off-eutectic composition. As a result, the LESD is bonded on the substrate by the gold-tin eutectic material. Since an external force is utilized during the said LESD die attachment, and no flux is needed during this process, the bonding performance has been found to be more encouraging as compared to flux eutectic die attachment. In some embodiments, a lateral die includes an anode and a cathode that have a different size. Bond sites located in cavity 210 for the two LESD contacts may be configured to accommodate this, e.g., by positioning gap 224 in the conductive material such that the anode bond site corresponds to the size of the anode and the cathode bond site corresponds to the size of the cathode. The lateral die may be bonded by any suitable known method.

In at least one aspect, the presence of gap 228 in conductive layer 220 and gap 226 in dielectric substrate 212 enable gap 224 to be formed by removing a portion of conductive material 218 from the bottom side of the structure.

Figure 4:
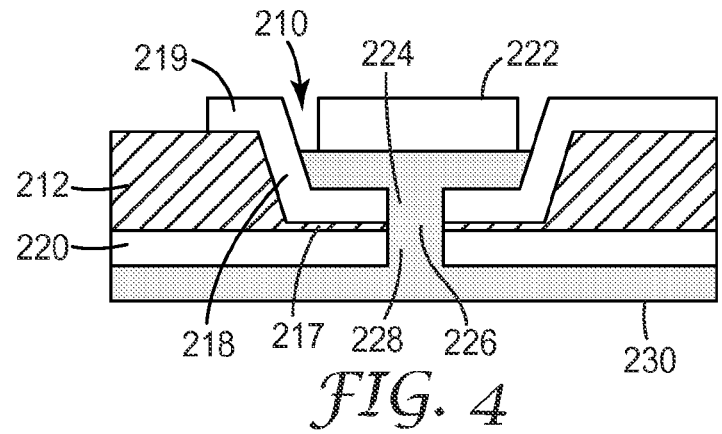
FIG. 4 is a schematic cross-sectional view of another exemplary embodiment of a flexible LESD according to an aspect of the present invention.

Having an aligned opening through layers 220, 212, and 218, as created by the existence of gaps 224, 226, and 228 allows a TIM or any suitable heat dissipation material to be applied into gaps 224, 226, and 228, and into cavity 210 so that it is adjacent to, or around the base of, LESD 222 as well as on to conductive layer 220 so that it can facilitate effective heat dissipation from LESD 222. An example of such a construction is shown in FIG. 4.

Figure 3:
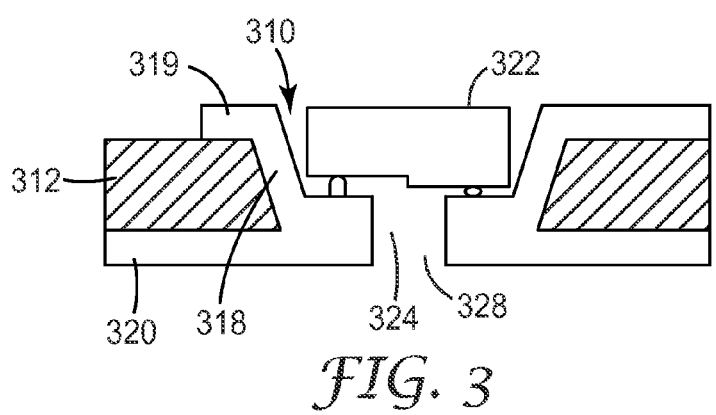
FIG. 3 is a schematic cross-sectional view of another exemplary embodiment of a flexible LESD according to an aspect of the present invention.

At least one embodiment of the present invention is illustrated in FIG. 3, which shows a flexible polymeric dielectric substrate 312 having at least one via 310 in which is located an LESD 322. Via 310 is an opening extending through the dielectric substrate from one surface to the other. It is initially defined by walls comprising dielectric substrate 312. It is closed off at one end by conductive layer 320 located on the bottom surface of dielectric substrate 312. Via 310 may be further defined by layers and coatings applied to its walls, which may also be applied to the portion of conductive layer 320 beneath the bottom opening of via 310. In the embodiment of FIG. 3, the walls and exposed portion of conductive layer 320 support conductive material 318. Conductive material 318 supports LESD 322 in via 310. LESD 322 may be flip chip die as shown, or a lateral die, i.e., the electrical contacts are on the bottom of the die. Gap 324 in conductive material 318 and gap 328 in conductive layer 320 electrically isolate bond sites located in via 310 for the two LESD contacts. Conductive layer 319 is located on the top surface of dielectric substrate 312. In some embodiments, conductive layer 319 comprises an electrically conductive circuit. Conductive layer 320 is preferably thermally conductive and optionally electrically conductive. In some embodiments, conductive layer 320 comprises an electrically conductive circuit. In at least one aspect, the presence of gap 328 in conductive layer 320 enables gap 324 to be formed in conductive material 318 from the bottom side of the structure.

Figure 6:
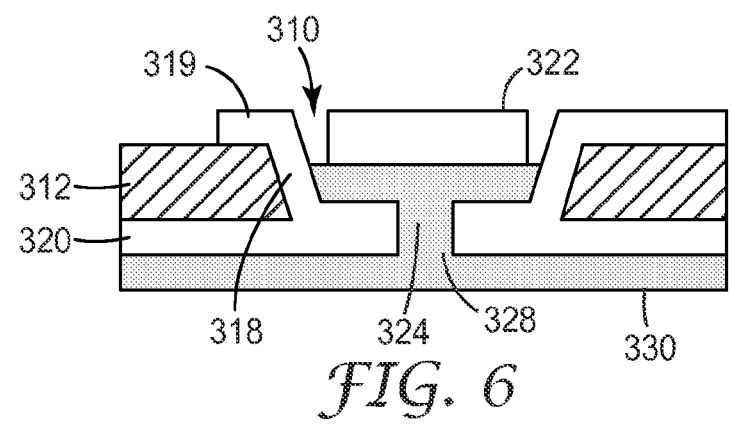
FIG. 6 is a schematic cross-sectional view of another exemplary embodiment of a flexible LESD according to an aspect of the present invention.

Having an aligned opening through layers 320 and 318, as created by the existence of gaps 324 and 328 allows a TIM or any suitable heat dissipation material to be applied into gaps 324 and 328 and into via 310 such that it is adjacent to, or around the base of, LESD 322 as well as on to conductive layer 320 so that it can facilitate effective heat dissipation from LESD 322. An example of such a construction is shown in FIG. 6. In at least one aspect, both conductive layers 319 and 320 may be both electrically conductive and heat dissipative, and may therefore provide effective thermal and electrical properties.

Figure 9:
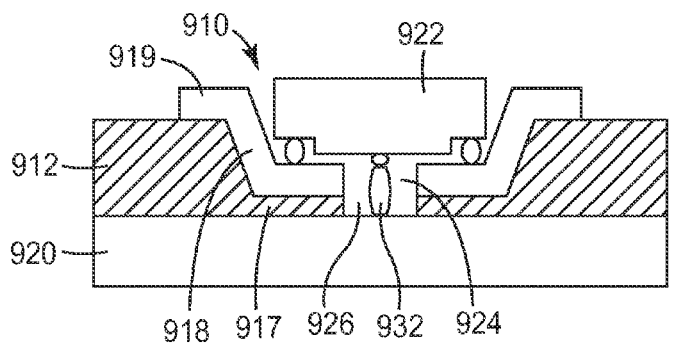
FIG. 9 is a schematic cross-sectional view of another exemplary embodiment of a flexible LESD according to an aspect of the present invention.
Figure 10:
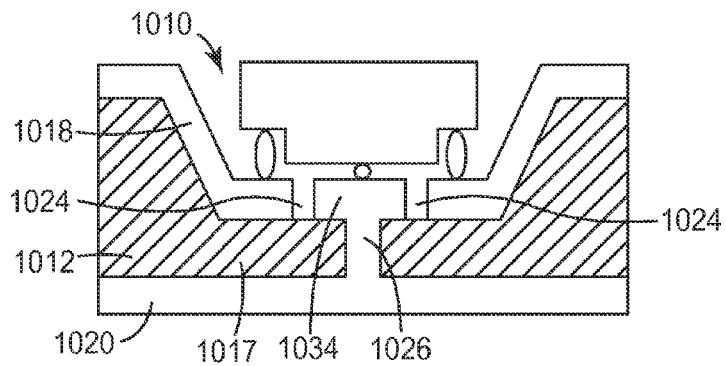
FIG. 10 is a schematic cross-sectional view of another exemplary embodiment of a flexible LESD according to an aspect of the present invention.

FIGS. 9 and 10 illustrate exemplary embodiments of a flexible LESD according to aspects of the present invention, wherein a large area LED, which may be a flip chip die or a lateral die as defined herein, is located in a cavity in a flexible polymeric dielectric substrate. A large area LED is defined herein as an LED that has three or more electrical contacts. In some embodiments, a large area LED has a cathode and multiple anodes to provide uniform current spreading to ensure a maximized and uniform LED light output. The connection of the multiple anodes to multiple corresponding conductive pads of the flexible LESD can provide an effective heat dissipation, which may extend the life of the LED. The presence of multiple connections also provides mechanical stability for the large LED dies.

Referring to FIG. 9, a flexible polymeric dielectric substrate 912 has at least one indentation or cavity 910 in which is located an LESD 922. LESD 922 is a large area LED that has a cathode positioned in the center of the LED and two anodes positioned at opposite ends of the LED. In other embodiments, the cathode and anodes may be positioned in any suitable location of the LED, and any suitable number of cathodes and anodes may be present on the LED. To accommodate LESD 922, the bond sites located in cavity 910 for the two anodes need to be electrically isolated from the bond site for the cathode. This may be done, for example as is shown in FIG. 9, by creating a gap 924 in conductive material 918 deposited in the cavity, and a gap 926 in the portion of dielectric substrate 912 comprising floor 917 of cavity 910. Gaps 924 and 926 facilitate an electrical connection of the cathode to its bond site on conductive layer 920, which may be established, for example as is shown in FIG. 9, by a solder plug 932. LESD 922 may be bonded by any suitable known method.

FIG. 10 illustrates an embodiment of the present invention, which can also accommodate the cathode and anodes of a large LED. In this embodiment, the bond sites located in cavity 1010 for the two anodes are electrically isolated from the bond site for the cathode, and an electrical connection is established between the cathode and conductive layer 1020. Two gaps 1024 are created in conductive material 1018 deposited in the cavity, creating a central conductive feature 1034 on floor 1017. A gap 1026 extending from the bottom of dielectric substrate 1012 to cavity 1010 is created and filled with an electrically conductive material to establish an electrical connection between conductive feature 1034 and conductive layer 1020. Conductive feature 1034 functions as the bond site for the cathode. In an alternate embodiment, conductive feature 1034 may be thermally conductive and electrically insulative and conductive layer 1020 and the conductive material in gap 1026 are thermally conductive (regardless of whether they are electrically conductive). In such case, a flip chip or lateral die would be suitable for use in the cavity. The thermal connection of conductive feature 1034 and conductive layer 1120 by the conductive material in gap 1026 will provide an effective heat dissipation away from the LESD in cavity 1010.

Figure 8:
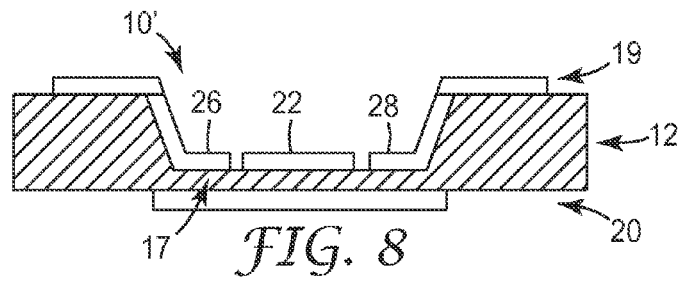
FIG. 8 is a schematic cross-sectional view of another exemplary embodiment of a flexible LESD according to an aspect of the present invention.

FIG. 8 illustrates an embodiment of the present invention, similar to the embodiment of FIG. 10. In the embodiment of FIG. 8, cavity 10' extends from the first surface toward the second surface of a polymeric dielectric substrate 12, a conductive feature 22 is located within cavity 10' and conductive pads 26 and 28 are located on either side of conductive feature 22 and are electrically connected to conductive layer 19. Conductive feature 22 may be one or both of thermally and electrically conductive. Conductive layer 20 may optionally be on the second surface of dielectric substrate 12 and a layer of TIM may optionally be applied to conductive layer 20 and/or the second surface of dielectric substrate 12. Conductive pads 26 and 28 are electrically insulated from each other and from conductive feature 22, if it is electrically conductive. Preferably, conductive feature 22, as well as conductive pads 26 and 28, are thermally conductive (regardless of whether they are electrically conductive) and can readily dissipate heat away from an LESD in cavity 10' through cavity floor 17 to (thermally) conductive layer 20.

Figure 7:
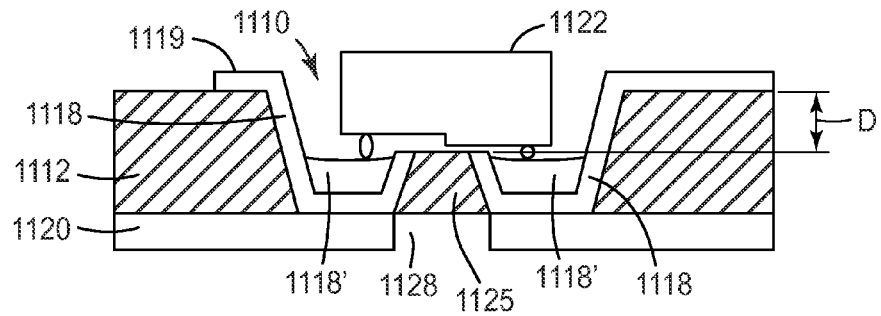
FIG. 7 is a schematic cross-sectional view of another exemplary embodiment of a flexible LESD according to an aspect of the present invention.

At least one embodiment of the present invention is illustrated in FIG. 7, which shows a flexible polymeric dielectric substrate 1112 having at least one via 1110 in which is located an LESD 1122. LESD 1122 is a flip chip die, but may in other embodiments be a lateral die. Further, bond sites located in via 1110 for the two LESD contacts need to be electrically isolated from each other. This may be done, for example as is shown in FIG. 7, by having a ridge 1125 in the via, effectively separating via 1110 into two separate smaller vias. Ridge 1125 may be formed by depositing dielectric material in via 1110, in which case conductive layer 1120 would need to initially cover the portion of the bottom surface of dielectric substrate 1112 where via 1110 will be located. Alternatively, ridge 1125 may be formed as part of a process for creating via 1110. For example, if a chemical etching process is used to create via 1110, a photomask may be patterned so that two areas to be etched all the way through to the opposite surface of the dielectric layer are so closely spaced that the dielectric material between those areas is partially etched. A method that could be used to achieve such a structure is generally described on page 11 of PCT Publication No. WO 2007/001995 A1 (WO '995), in reference to FIGS. 7A-7C. Although the dielectric substrates in WO '995 are only partially etched, to obtain the desired features of the present embodiment, the pitch of the areas to be etched can be appropriately located. Using this method, the partially etched portion will typically have a sharp peak. This peak may be laser ablated or otherwise removed to form ridge 1125. In an alternate method, via 1110 may be partially etched to a depth D to essentially form a cavity, then a photomask may be placed down the center of the cavity floor and etching may continue until the small via on either side of the masked dielectric material (which becomes ridge 1125) are formed. The via walls, the ridge walls, and the exposed portion of conductive layer 1120 support conductive material 1118, which can be deposited at the same time as conductive layer 1119 and additional conductive material 1118', which can be deposited subsequently into the separate smaller vias within via 1110. Conductive materials 1118 and 1118' may be the same or different. Conductive material 1118' is electrically conductive and preferably also thermally conductive and supports LESD 1122 in via 1110. If conductive layer 1120 is electrically conductive, a gap 1128 can be created to electrically separate the bond pads for the LESD.

Although the exemplary embodiments of flexible LESDs described herein pertain to the use of wire bond free LESDs, with slight modifications that could be ascertained by one of ordinary skill in the art, the structures described herein could also be used with LESDs having one or both electrodes that requires wire bonding.

Application of a TIM may further enhance the thermal performance of flexible LESDs according to aspects of the present invention. A conformable TIM may be laminated on the bottom side of the flexible substrate and may conform, e.g., to fill the cavity or via. Tailoring the viscosity of the TIM may enable the TIM to serve as a suitable underfill for the flip chip die. Tailoring the coefficient of thermal expansion (CTE) of the TIM may help improve the structural integrity of the device.

Any suitable TIM may be used in embodiments of the present invention. Depending on the embodiment, the TIM may be applied to the flexible LES device as a liquid, paste, gel, solid, etc. Suitable methods for applying TIM depend on the properties of the specific TIM, but include precision coating, dispensing, screen printing, lamination, etc.

Suitable methods for curing a curable TIM include UV curing, thermal curing, etc.

The TIM may be coated on, e.g., as a liquid or a semi-solid such as a gel or paste, or may be laminated on in sheet form. A combination of TIMs could be used. For example, a first type of TIM may be applied in the vias or cavities and a second type of TIM may be applied to the second major surface of the dielectric layer, which would bring it into contact with the first type of TIM. If a sheet of TIM is applied to the second major surface of the dielectric layer without previously filling the vias or cavities with TIM, the sheet is preferably sufficiently conformable or reconfigurable to fill the vias or cavities. For example, a suitable type of sheet material would be an uncured thermoset material that, upon application of heat, would soften sufficiently to fill the vias or cavities before curing. In some embodiments, the TIM may also be adhesive-based. In such an embodiment, the TIM could adhere directly to the second major surface of the dielectric layer on one side and a conductive substrate on the other. A TIM that does not have adhesive properties could be applied to one or both of the second major surface of the dielectric layer and the conductive substrate with a thermally conductive adhesive. As previously mentioned, the TIM may be first applied to the second major surface of the dielectric layer and a conductive substrate applied to the TIM thereafter, or the TIM may be first applied to a conductive substrate and the TIM-coated conductive substrate applied to the second major surface of the dielectric layer thereafter.

In some embodiments a suitable TIM may be a paste-like thermally conductive material, such as silicone grease, and in other embodiments a sheet-like thermally conductive material, such as silicone rubber. In still other embodiments, a combination of the two may be used.

Types of materials suitable for use in TIMs include, but are not limited to curable thermosets, thermoplastics, including thermoplastics with conductive fillers, pressure sensitive adhesives, and elastomers. Specific materials suitable for use in TIMs include silicone, polyimide, epoxy, B-stage UV curable adhesives, and high temperature silicon based adhesives.

Suitable TIMs may be filled with thermally conductive material that may or may not also be electrically conductive. Suitable materials include silver, gold, nickel, copper, metal oxides, boron nitride, alumina, magnesium oxides, zinc oxide, aluminum, aluminum oxide, aluminum nitride, silver-coated organic particles, silver plated nickel, silver plated copper, silver plated aluminum, silver plated glass, silver flakes, carbon particles, carbon black, carbon allotropes such as graphite, graphene, carbon nanotubes, boron-nitride coated particles, and mixtures thereof. The thermally conductive materials may be in the form of particles, spheres, flakes, or any other suitable form. In at least some embodiments, the thermally conductive material may comprise about 5 wt % to about 60 wt % of the TIM, preferably about 10 wt % to about 50 wt %.

TIMs suitable for use in the present invention may include, for example, adhesives filled with one or more of alumina, aluminum nitride, boron nitride, carbon nanotubes, carbon particles, and graphene.

Preferably the TIMs have low thermal resistance; are capable of wetting substrates with high surface energy, such as metals, and low surface energy, such as plastics; will remain adhered to the surfaces to which it is attached and will not flow to any unwanted areas of the devices to which it is being applied.

Figure 5:
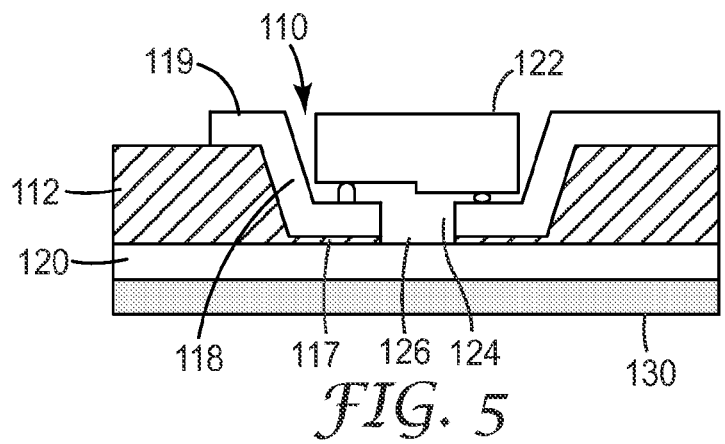
FIG. 5 is a schematic cross-sectional view of another exemplary embodiment of a flexible LESD according to an aspect of the present invention.

At least one embodiment of the present invention is illustrated in FIG. 5, which shows a flexible LESD similar to the flexible LESD shown in FIG. 1, having a TIM 130 is disposed on conductive layer 120.

In each of the exemplary embodiments described herein, the vias and cavities may be any suitable shape, e.g., circular, oval, rectangular, serpentine, a channel, a grid (e.g., forming islands of dielectric substrate separated by a continuous pattern of overlapping channels), etc., and may contain a single LESD or may contain multiple LESDs. For example, if the via or cavity is channel-shaped or grid-shaped, or large, multiple LESDs may be located in a single via or cavity.

In each of the exemplary embodiments described herein, the flip chip die may be bonded to the isolated conductors of the flexible substrate by a flip chip bonding process. To facilitate this, the isolated conductors may be provided with respective conductive bumps. The lateral die may be bonded to the isolated conductors of the flexible substrate using a direct die attach method. An exemplary bonding method that can be used in aspects of the present invention for bonding a wire bond free die (including, e.g., a flip chip die and a lateral die) includes using an anisotropic conductive film (ACF). First, the ACF is applied onto the isolated conductors using a pick and place method. Then, the die is attached in a flip chip configuration (in case of a flip chip die) or a lateral configuration (in case of a lateral die) using temperature and force. The ACF is activated and adjusts to the desired thickness to make the electrical connections between the wire bond free die and the isolated conductors by alignment of the particles anisotropically providing the electrical contacts with the respective contact pads of the wire bond free die. Another exemplary bonding method that can be used in aspects of the present invention includes using a conductive adhesive where the conductive adhesive is placed on the isolated conductors. When placing the die in a flip chip configuration (in case of a flip chip die) or a lateral configuration (in case of a lateral die) under pressure, the conductive adhesive conforms and adjusts to the desired thickness to make the electrical connections between the wire bond free die and the isolated conductors. Another exemplary bonding method that can be used in aspects of the present invention includes creating metal solder bumps on the isolated conductors. Solder flux is applied onto the solder bumps and the wire bond free die is placed on the solder bumps. Using a solder reflow process, the solder bumps initiate the bonding and adjust to the desired thickness to make the electrical connections between the wire bond free die and the isolated conductors.

An advantage of flexible LESDs according to aspects of the present invention relates to a laser lift-off process. For certain wire bond free LESDs, such as, e.g., high power blue LEDs, a gallium nitride (GaN) or indium gallium nitride (InGaN) semiconductor layer, in some cases having a thickness of a few microns, is grown on a sapphire (Al2O3) substrate, in some cases having a thickness of 120-150 microns. Mainly to achieve high power operations, the sapphire may be removed from the semiconductor layer using a laser lift-off process. In a typical laser lift-off process, a high intensity laser beam is directed through the sapphire and aimed at the semiconductor layer. This creates a shockwave at the interface disassociating the sapphire from the semiconductor layer. During this process, stress is transmitted to the relatively thin semiconductor layer. For wire bond free dies on rigid substrates, such as, e.g., silicon (Si) or ceramics, this stress may cause the semiconductor layer to later crack. However, for wire bond free dies on flexible LESDs according to aspects of the present invention, the flexible dielectric layer may act as a stress accommodating layer, which will help keep the semiconductor layer intact.

At least one embodiment of the present invention provides a flexible LESD array construction using a partially etched dielectric substrate. A cavity is etched into the dielectric substrate to a desired depth. The cavities may have a conductive material deposited therein in any suitable manner, such as coating, vapor deposition, plating etc., but the conductive material is typically plated either using electro or electroless plating. The conductive material in the cavity is preferably electrically conductive and optionally thermally conductive. LESDs are typically attached directly or indirectly to the conductive material using a known die bonding method such as eutectic, solder (including solder bumps for flip chip mounting), adhesive, and fusion bonding. In at least one embodiment of the present invention, a thermally conducting layer is located on the bottom surface of the dielectric substrate and may be a portion of an electrical circuit formed using conventional flexible circuit manufacturing processes. The portion of the dielectric layer that forms the floor of the cavity places the conductive material in the cavity and the conductive layer on the bottom surface of the dielectric material in close proximity, which allows for dissipating heat generated by the LESD efficiently through electrically and thermally conductive material in the cavity or via, then through the floor of the cavity to the thermally conductive layer on the bottom surface of the dielectric substrate.

At least one embodiment of the present invention provides a flexible LESD array construction using a fully etched dielectric substrate. A via is etched through the dielectric substrate, i.e., from one major surface to an opposite major surface. The bottom opening of the via is typically covered by a conductive layer on the bottom surface of the dielectric substrate. In at least one embodiment of the present invention, this conductive layer is a thermally conducting layer and may be a portion of an electrical circuit formed using conventional flexible circuit manufacturing processes. The vias may have a conductive material deposited therein in any suitable manner, such as coating, vapor deposition, plating etc., but the conductive material is typically plated either using electro or electroless plating. Because the via forms an opening through the dielectric substrate, the conductive material in the via and the conductive layer on the bottom surface of the dielectric substrate are in direct contact. If both are thermally conductive, this allows for dissipating heat generated by the LESD efficiently through the conductive material in the via to the conductive layer on the bottom surface of the dielectric substrate.

The conductive material in the cavities or vias may be as thin on the cavity floor or conductive layer covering the via opening as it is on the cavity or via walls, or it may be thinner or thicker. If it is thicker, it may partially or fully fill the cavity or via. For embodiments in which additional conductive material is added in the center of the cavity or via after a layer of conductive material has been applied to at least the walls of the cavity or via, the added conductive material results in a thicker amount of conductive matter in the bottom of the cavity or via than on the (upper) cavity or via walls and, therefore, added conductive material may partially or fully fill the cavity or via. The added conductive material may fill the cavity or via to any suitable level, e.g., 10%, 15%, 25% or greater. In some embodiments, the conductive material fills a larger percentage of the cavity or via, e.g., about 50%, about 75%, or about 100.

In some embodiments, the conductive layer on the top surface of the dielectric substrate extends into the cavity or via and forms all or part of the conductive material in the cavity or via. Optionally, additional conductive matter can be deposited in the cavity or via to increase the thickness of the conductive material. In some embodiments, the entire top conductive layer, including the portion that comprises the conductive material in the cavity or via, is made relatively thick and no additional conductive material is added in the cavity or via. In at least some embodiments of the present invention, a top conductive, e.g., copper, layer with a thickness of about 50 um to about 100 um, preferably about 75 um to about 100 um, on the dielectric layer surface, and in the cavity or via, may significantly enhanced heat dissipation away from the LESD The conductive layer on the bottom surface of the dielectric substrate may be any suitable thickness. Making this conductive layer thick, e.g., about 35 micrometers (um), preferably about 50 um, about 75 um, about 100 um or more may enhance heat removal from the LESDs.

Furthermore, controlling the area dimensions of the cavity floor or bottom via can significantly influence heat dissipation from the LESD to the conductive material in the cavity via and further to the conductive layer on the bottom surface of the dielectric substrate. Generally, increasing the ratio of the cavity floor area or via opening to the LESD footprint area provides better heat dissipation. Ratios of 1:2 (LESD footprint: cavity floor area/via opening) and above may improve heat dissipation over a 1:1 ratio, with a ratio of 1:3 believed to provide the most significant increase in heat dissipation. It is believed that this ratio helps dissipate heat in the z direction before spreading the heat out over a larger surface area, e.g., using an adjacent heat transfer layer. Although a ratio of 1:2 might help with heat dissipation and higher ratios such as 1:4 may be used, it is believed that a 1:3 ratio will provide a significant improvement over, e.g., a 1:1 ratio, while a 1:4 ratio may provide only an incremental improvement over a 1:3 ratio.

Suitable conductive matter for use in the electrically and/or thermally conductive layers of the present invention will depend on the application, but may include, for example, conductive metals such as copper, silver, gold, nickel, aluminum, tin, and alloys thereof; thermally and electrically conductive adhesives, including non-conducting adhesives filled with conductive material, e.g., conductive particles, such that the resulting adhesive is conductive.

Suitable conductive matter for use in the conductive materials of the present invention will also depend on the application, but may include metals such as copper, gold, silver, nickel aluminum, tin, and alloys thereof as well as solders, conductive polymers, and conductive adhesives, including non-conductive polymers and adhesives filled with conductive material, e.g., conductive particles, such that the resulting matter is conductive.

Suitable electrically and/or thermally conductive particles include aluminum, gold, silver, chromium, copper, palladium, nickel and alloys thereof, aluminum nitride (AlN), aluminum oxide (Al2O3), barium nitride (BN), nanometer-sized silver particles, carbon blacks, carbon nanotubes (CNT), fullerenes, graphenes, carbon fillers, barium titanate, barium strontium titanate, titanium oxide, lead zirconium titanate, calcium copper titanate, lead magnesium titanate, lead lanthanium zirconate titanate, silicon dioxide, and mixtures thereof.

Suitable polymeric materials for use in the flexible polymeric dielectric layer of the present invention include polyesters, polycarbonates, liquid crystal polymers, and polyimides. Polyimides are preferred. Suitable polyimides include those available under the trade names KAPTON, available from DuPont; APICAL, available from Kaneka Texas corporation; SKC Kolon PI, available from SKC Kolon PI Inc, and UPILEX and UPISEL including UPILEX S, UPILEX SN, and UPISEL VT, all available from Ube Industries, Japan. These UPILEX and UPISEL polyimides are made from monomers such as biphenyl tetracarboxylic dianhydride (BPDA) and phenyl diamine (PDA).

Cavities or vias may be formed in the dielectric substrates using any suitable method such as chemical etching, plasma etching, focused ion-beam etching, laser ablation, embossing, microreplication, injection molding, and punching. Chemical etching may be preferred in some embodiments. Any suitable etchant may be used and may vary depending on the dielectric substrate material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in co-pending U.S. Provisional Patent Application No. 61/409,791, incorporated herein by reference. Subsequent to etching, the dielectric substrates may be treated with an alkaline KOH/potassium permanganate (PPM) solution, e.g., a solution of about 0.7 to about 1.0 wt % KOH and about 3 wt % $KMnO_4$.

The side wall angle resulting from chemical etching varies, and is most dependent on etch rate, with slower etching rates resulting in shallower side wall angles, i.e., closer to 0°. Typical side wall angles resulting from chemical etching are about 5° to 60° from the major plane of the dielectric layer, and in at least one embodiment, about 25° to about 28°. As previously mentioned as an alternative to chemical etching, cavities or vias in the dielectric substrate may be formed by punching, plasma etching, focused ion-beam etching, and laser ablation. With these methods of forming a cavity or via, the side walls typically have a steeper angle, e.g., up to 90° from the major plane of the dielectric layer. For purposes of this application, a sloped side wall means a side wall that is not perpendicular to the horizontal plane of the dielectric layer. Cavities or vias with sloped sidewalls could also be made using methods such as embossing, microreplication, and injection molding. If a via is initially formed, but a cavity is desired, a dielectric coating, such as a polyimide coating, may be added to electrically insulate the cavity from a conductive layer on the bottom side of the dielectric substrate, thus forming a cavity. The dielectric material may be any suitable material, e.g., a polymeric material, a ceramic material, a particle-loaded polymeric material, etc. and may be applied in any suitable manner. The dielectric coating is electrically insulating and, preferably, thermally conducting to facilitate transfer of heat away from the LESD. One such suitable coating is a polyimide resin formed by first applying a thin layer of polyamic acid resin in the opening. The polyamic acid is preferably precision-coated such that the dielectric coating formed at the bottom of the cavity provides the desired thickness for the cavity floor. The thickness of the cavity floor is preferably about 5% to about 75%, about 5% to about 60%, or about 5% to about 25% of the thickness of the dielectric substrate layer. Subsequently, an imidization process is carried out to form a uniform polyimide coating in the cavity. The polyimide/polyamic acid resin can be applied using precision coating, knife coating, or other methods known in the art.

In some embodiments, the dielectric coating may be filled with particles to enhance its electrically insulating and thermally conducting properties. Suitable particles include aluminum nitride (AlN), aluminum oxide (Al2O3), barium nitride (BN), nanometer-sized silver particles, carbon nanotubes (CNT), fullerenes, graphenes, carbon fillers, barium titanate, barium strontium titanate, titanium oxide, lead zirconium titanate, calcium copper titanate, lead magnesium titanate, lead lanthanium zirconate titanate, silicon dioxide, and mixtures thereof.

A conductive layer may be applied to the bottom side of the dielectric substrate before the cavity or via is formed if the cavity- or via-forming method would not destroy the conductive layer, e.g., because the etching depth can be controlled and/or because the cavity- or via-forming method will not etch or degrade the conductive layer, such as with plasma etching, or it may be added after the cavity is formed if the cavity- or via-forming method would destroy the conductive layer, such as with punching.

The dielectric substrates may be clad on one or both sides with a conductive layer. If the conductive layer(s) are to be formed into circuits, they may be pre-patterned, or may be patterned during the process of making the flexible LES devices. A multilayer flexible substrate (having multiple layers of dielectric and conductive material) may also be used as a substrate. The conductive layers may be any suitable material, but are typically copper.

At least some embodiments of the flexible LES devices of the present invention provide excellent heat management properties. Due at least in part to the conductive materials in the cavities or vias and thin or absent dielectric floors of the cavities or vias supporting the LESDs, heat generated by the LESDs can be readily transmitted to a thermally conductive layer on the bottom side of the dielectric substrate. In this manner, heat can be readily conducted away from the LESD.

In at least one embodiment of the present invention, the conductive layer on the bottom side of the dielectric substrate may be a thermally conductive adhesive. The adhesive layer may be used as an etch stop if a via is formed or may be applied to the dielectric substrate after the cavity or via is formed. If the thermally conductive adhesive is used as an etch stop, suitable adhesives are those that are resistant to chemicals, especially those resistant to alkali solutions. Other layers may be applied to the opposite side of the thermally conductive adhesive layer (before or after the adhesive is applied to the dielectric substrate). For example, thermal interface materials, metal foils, rigid metal plates, heat sinks, etc. can be attached to the adhesive layer. Having the thermally conductive adhesive layer adjacent the cavity or via can enhance the dissipation of heat away from the LESD which sits in the cavity or via. The thermal conductivity of the adhesive can be tailored by adding required amount of suitable thermally conductive particle and by tailoring the thickness of the adhesive. Typical thermally conductive particle used in thermally conductive adhesives are aluminum nitride (AlN), aluminum oxide (Al2O3), barium nitride (BN), nanometer-sized silver particles, carbon nanotubes (CNT), fullerenes, graphenes, carbon fillers, etc. The size of the particles is typically in the sub-micron to micron range. The typical thermal conductivity of such filled adhesives is from about 0.2 to about 6 W/mK.

Suitable adhesive types for use in thermally conductive adhesives include, but are not limited to, epoxies, polyurethanes, polyamideimides, and phenolic resins.

Suitable curing processes for the thermally conductive adhesives include, but are not limited to, thermal, UV, E-beam, UV-beta stage (a combination of UV and thermal cure in which the adhesives are coated onto a liner, subjected to an initial UV cure initially, then laminated onto a substrate and thermally cured), and combinations thereof.

If the adhesive is adhered to a conductive, e.g., copper, layer before being applied to the dielectric substrate, the adhesive typically is either coated on a liner and laminated with a copper foil or coated directly on the copper foil. Electrodeposited or rolled annealed coppers are preferred. If the copper has a rough side and a smooth side, it is typically preferable to attach the adhesive to the rough side.

The LESDs can be packaged directly on the flexible substrate, e.g., by applying an encapsulating material over individual LESDs and the cavities or vias in which they are located, or by applying an encapsulant over an array of LESDs and the conductive layer around such LESDs. The encapsulant is preferably a transparent (i.e., having a transmittance over 99%) molding compound. It may optionally be suitable to act as a lens when cured. Silicones and epoxies are suitable encapsulating compounds. It may further contain optical diffusing particles distributed therein. Suitable molding compounds may be purchased, e.g., from Shin-Etsu Chemical Co., Ltd., of Japan and NuSil Silicone Technology of Santa Barbara, Calif. If desired, a wavelength converting material, such as a phosphor coating, may be deposited on top of the LESD prior to encapsulation. An underfill material may optionally be applied prior to encapsulating the LESD. The flexible LES devices may also be enclosed in a waterproof/weatherproof, transparent casing, which may be made from any suitable polymeric transparent material.

In at least one embodiment of the present invention, the encapsulant is a transparent color conversion material, which can absorb light emitted from the LES of the LESD and re-emit the light at a different, typically higher, wavelength. For example, a color conversion material containing yellow phosphors may be used to encapsulate a blue LED, which can produce a white light. In some embodiments of the present invention, the slopes of the cavity or via sidewalls can be tailored to create a uniform thickness of the color conversion layer surrounding the LESD to provide uniform light conversion, and preferably, superior thermal management. In at least one embodiment of the present invention, the slopes of the cavity or via sidewalls are about 5° to about 90°. An advantage of at least one embodiment of the present invention is that placing the LESD in a cavity or via enables precise placement of the encapsulant because it can be contained in the cavity or via. An advantage of at least one embodiment of the present invention is that placing the LESD in the center of a cavity or via and filling the cavity or via with encapsulant creates uniform light conversion due to the uniform layer of encapsulant that can be created around the LESD. In an alternate embodiment of the present invention, instead of encapsulating the LESD with the color conversion material, a layer of the color conversion material is coated in the cavity or via prior to placing the LESD in the cavity or via. In this manner, the color conversion material can absorb at least some of the light emitted from the LES and re-emit the light at a different, typically higher, wavelength. An example of a suitable color conversion material is a phosphor-filled encapsulant. Such an encapsulant may be made by mixing yellow phosphor, such as that available under the trade designation ISIPHOR SSA612100 from Merck, with a suitable silicone encapsulant having suitable adhesion properties. A weight ratio of 75% phosphor to silicone adhesive may be suitable in some embodiments. After the encapsulant is dispensed into the cavity or via, in some embodiments it may be cured by exposure to UV light at 80° C. for an hour.

In at least some embodiments of the present invention, the dielectric substrate and the conductive layers on one or both of the major surfaces of the dielectric substrate support and surround the LESDs, thereby providing a flexible, robust LESD package.

The flexible LES devices can be made in a batch process or a continuous process such as a roll-to-roll process that is often used in making flexible circuits. The LESDs can then be divided as desired, e.g., singulated into individual LESDs, strips of LESDs, or arrays of LESDs, e.g., by stamping or by slitting the substrate. Accordingly, an entire reel of LESDs on a flexible substrate can be shipped without the need for the traditional tape and reel process in which individual LESDs are typically transported in individual pockets of a carrier tape.

Before or after forming individual, strips, or arrays of LESDs, the flexible LESDs can be attached to an additional substrate, for example by attaching the conductive layer on the second major surface of the dielectric substrate to the additional substrate with a thermally conductive adhesive. The thermally conductive adhesive can further facilitate the transfer of heat away from the LESD. Alternatively, the conductive layer on the second major surface of the dielectric substrate may be treated with metals or other materials that will facilitate its adhesion to a substrate. The substrate may also be thermally conductive, e.g., a rigid metal strip, or may be a semiconductor or ceramic substrate, which may or may not be electrically conductive.

The flexible LES devices can be attached to any desired substrate, depending on their intended use. For example, they can be attached to flexible or rigid metal substrates, such as copper or aluminum, heat sinks, dielectric substrates, circuit boards, etc. If the LESDs are for use on a circuit board, the flexible LES devices, whether in singulated, strip, or array form can be directly attached to an end user's circuit board, thereby eliminating the need for conventional lead frame materials. If the LESDs are for use as a lighting strip, they could be enclosed in a waterproof/weatherproof, transparent casing, as described above. If the LESDs are in strip or array form, they may be electrically connected to one or more of the other LESDs in the strip or array. Additional elements such as Zener diodes and Schottky diodes can also be added to the flexible substrate prior to be division of the flexible LES devices. These elements may also be electrically connected to the LESDs.

In at least one embodiment of the present invention, the flexible LES devices are thinner than conventional single or multiple LESD packages because the LESD sits below the surface of the dielectric substrate. This enables the flexible LES devices of the present invention to be used in applications with tight volume restrictions, such as cell phones and camera flashes. For example, the flexible LES devices of the present invention can provide a package profile of approximately 0.7 to 4 mm, and in some embodiments 0.7 to 2 mm whereas conventional LESD package profiles are typically greater than 4 mm and are approximately 4.8 mm to 6.00 mm. Moreover, the flexible LES devices of the present invention can be flexed or bent to easily fit into a non-linear or non-planar assembly if desired.

In at least one embodiment, the dielectric substrate and copper layers thereon provide a thin and compliant support for the LESDs. In at least one embodiment, the total thickness of the conductive layers is less than 200 micrometers, preferably less than 100 micrometers, and most preferably less than 50 micrometers. In at least one embodiment, the thickness of the dielectric substrate is preferably 50 micrometers or less.

In at least one embodiment of the present invention a passivation layer can be applied to the bottom of LESD to facilitate die bonding of the LESD to the conductive feature or to an intermediate material such as a reflective layer. Suitable passivation materials include metals such as Au and intermetallic alloy(s) such as AuSn, AuGe, AuSi.

Following are exemplary embodiments of an article according to aspects of the present invention.

Embodiment 1 is an article comprising: a flexible polymeric dielectric layer having first and second major surfaces, the first major surface having a conductive layer thereon and having at least one cavity therein, the at least one cavity containing a conductive material including electrically separated first and second portions configured to support and electrically connect a light emitting semiconductor device to the conductive layer on the first major surface.

Embodiment 2 is the article of embodiment 1, wherein the conductive material in the cavity is electrically insulated from the second major surface.

Embodiment 3 is the article of embodiment 1, wherein the conductive layer on the first major surface comprises a circuit.

Embodiment 4 is the article of embodiment 1, wherein the second major surface has a conductive layer thereon.

Embodiment 5 is the article of embodiment 4, wherein the conductive material in the cavity is electrically connected to the conductive layer on the second major surface.

Embodiment 6 is the article of embodiment 4, wherein the conductive layer on the second major surface comprises a circuit.

Embodiment 7 is the article of embodiment 4 further comprising a thermal interface material disposed adjacent the conductive layer on the second major surface.

Embodiment 8 is the article of embodiment 4, wherein the conductive layer on the second major surface includes electrically separated first and second portions.

Embodiment 9 is the article of embodiment 8, wherein the first and second portions of the conductive layer on the second major surface are electrically separated by a gap.

Embodiment 10 is the article of embodiment 9 further comprising a thermal interface material disposed in the gap.

Embodiment 11 is the article of embodiment 1, wherein the first and second portions of the conductive material are electrically separated by a gap or a ridge.

Embodiment 12 is the article of embodiment 11 further comprising a thermal interface material disposed in the gap.

Embodiment 13 is the article of embodiment 1 further comprising a light emitting semiconductor device supported and electrically connected to the conductive layer on the first major surface by the first and second portions.

Embodiment 14 is the article of embodiment 13, wherein the light emitting semiconductor device is a flip chip die.

Embodiment 15 is the article of embodiment 13, wherein the light emitting semiconductor device is a lateral die.

Embodiment 16 is the article of embodiment 13, wherein the light emitting semiconductor device is flip chip bonded to the conductive material.

Embodiment 17 is the article of embodiment 13, wherein the light emitting semiconductor device is bonded to the conductive material using a direct die attach method.

Embodiment 18 is the article of embodiment 13 further comprising a thermal interface material disposed between the conductive material and the light emitting semiconductor device.

Embodiment 19 is the article of embodiment 1, wherein the light emitting semiconductor device is at least partially disposed in the at least one cavity.

Embodiment 20 is the article of embodiment 1, wherein the dielectric layer comprises a polyimide core and thermoplastic polyimide layers on one or both sides of the core.

Embodiment 21 is the article of embodiment 1, wherein the at least one cavity is at least 25% filled with conductive material.

Embodiment 22 is the article of embodiment 1, wherein the top surface of the at least one cavity is reflective.

Embodiment 23 is the article of embodiment 1, wherein the top surface of the at least one cavity comprises a reflective material applied over at least a portion of the conductive material in the at least one cavity.

Embodiment 24 is the article of embodiment 23, wherein the reflective material is selected from the group consisting of gold, silver, aluminum with enhanced reflectivity, an inherently reflective dielectric material, and a pigmented material.

Embodiment 25 is the article of embodiment 1, wherein the distance between the bottom of the at least one cavity and the second major surface is about 5% to about 75% of the thickness of the dielectric layer.

Embodiment 26 is the article of embodiment 1, wherein the floor of the cavity comprises a dielectric coating disposed at the bottom of the at least one cavity to electrically insulate the at least one cavity from the second major surface of the dielectric layer.

Embodiment 27 is the article of embodiment 26, wherein the dielectric coating is about 5% to about 75% of the thickness of the dielectric layer.

Embodiment 28 is the article of embodiment 1, wherein the at least one cavity has walls that slope from the first major surface to the bottom of the at least one cavity at an angle of about 5° to about 60° from the major plane of the dielectric layer.

Embodiment 29 is the article of embodiment 1, wherein the at least one cavity has walls that slope from the first major surface to the bottom of the at least one cavity at an angle of about 90° from the major plane of the dielectric layer.

Embodiment 30 is an article comprising: a flexible polymeric dielectric layer having first and second major surfaces, the first and second major surfaces each having a conductive layer thereon, the dielectric layer having at least one via extending from the first major surface to the second major surface, the at least one via containing a conductive material electrically connected to the conductive layer on the second major surface and including electrically separated first and second portions configured to support and electrically connect a light emitting semiconductor device to the conductive layer on the first major surface.

Embodiment 31 is the article of embodiment 30, wherein the conductive layer on the first major surface comprises a circuit.

Embodiment 32 is the article of embodiment 30, wherein the conductive layer on the second major surface comprises a circuit.

Embodiment 33 is the article of embodiment 30 further comprising a thermal interface material disposed adjacent the conductive layer on the second major surface.

Embodiment 34 is the article of embodiment 30, wherein the conductive layer on the second major surface includes electrically separated first and second portions.

Embodiment 35 is the article of embodiment 34, wherein the first and second portions of the conductive layer on the second major surface are electrically separated by a gap.

Embodiment 36 is the article of embodiment 35 further comprising a thermal interface material disposed in the gap.

Embodiment 37 is the article of embodiment 30, wherein the first and second portions of the conductive material are electrically separated by a gap or a ridge.

Embodiment 38 is the article of embodiment 37 further comprising a thermal interface material disposed in the gap.

Embodiment 39 is the article of embodiment 30 further comprising a light emitting semiconductor device supported and electrically connected to the conductive layer on the first major surface by the first and second portions.

Embodiment 40 is the article of embodiment 39, wherein the light emitting semiconductor device is a flip chip die.

Embodiment 41 is the article of embodiment 39, wherein the light emitting semiconductor device is a lateral die.

Embodiment 42 is the article of embodiment 39, wherein the light emitting semiconductor device is flip chip bonded to the conductive material.

Embodiment 43 is the article of embodiment 39, wherein the light emitting semiconductor device is bonded to the conductive material using a direct die attach method.

Embodiment 44 is the article of embodiment 39 further comprising a thermal interface material disposed between the conductive material and the light emitting semiconductor device.

Embodiment 45 is the article of embodiment 39, wherein the light emitting semiconductor device is at least partially disposed in the at least one via.

Embodiment 46 is an article comprising a flexible polymeric dielectric layer having a first major surface with a first conductive layer thereon and having a second major surface with a second conductive layer thereon, the dielectric layer having at least one cavity, or via, extending from the first major surface toward, or to, the second major surface; the first conductive layer extending into the at least one cavity, or via; and the at least one cavity, or via, containing a conductive feature and two conductive pads, the conductive pads electrically insulated from each other and from the conductive feature.

Following are exemplary embodiments of a method according to aspects of the present invention.

Embodiment 47 is a method comprising: providing a flexible polymeric dielectric layer having a first major surface and a second major surface; creating a conductive layer on the first major surface; creating at least one cavity in the first major surface; applying a conductive material in the at least one cavity, the conductive material including electrically separated first and second portions that are in electrical contact with the conductive layer; and placing a light emitting semiconductor device in the at least one cavity and bonding it to the first and second portions.

Embodiment 48 is a method comprising: providing a flexible polymeric dielectric layer having a first major surface and a second major surface; creating a conductive layer on the first and second major surfaces; creating at least one via extending from the first major surface to the second major surface; applying a conductive material in the at least one via such that the conductive material is in electrical contact with the conductive layer on the second major surface, the conductive material including electrically separated first and second portions that are in electrical contact with the conductive layer on the first major surface; and placing a light emitting semiconductor device in the at least one via and bonding it to the first and second portions.

Embodiment 49 is the method of any one of embodiments 47 to 48, wherein bonding the light emitting semiconductor device includes flip chip bonding.

Embodiment 50 is the method of any one of embodiments 47 to 48, wherein bonding the light emitting semiconductor device includes bonding using a direct die attach method.

Embodiment 51 is the method of any one of embodiments 47 to 48 further comprising applying a thermal interface material.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. An article comprising:
a flexible polymeric dielectric layer having a first major surface and an opposing second major surface, the first and second major surfaces each having a conductive layer thereon, the dielectric layer having at least one via extending from the first major surface to the second major surface, the at least one via containing a conductive material electrically connected to the conductive layer on the second major surface and including electrically separated first and second portions, the first and second portions having respective first and second top surfaces facing the first major surface and opposing first and second bottom surfaces facing the second major surface, the first and second top surfaces configured to support and electrically connect a light emitting semiconductor device to the conductive layer on the first major surface.

2. The article of claim 1, wherein the first and second portions of the conductive material are electrically separated by a gap or a ridge.

3. The article of claim 1 further comprising a light emitting semiconductor device supported and electrically connected to the conductive layer on the first major surface by the first and second portions.

4. The article of claim 3, wherein the light emitting semiconductor device is a flip chip die or a lateral die.

5. The article of claim 3 wherein a gap between the electrically separated first and second portions has a width smaller than a width of the light emitting semiconductor device.

* * * * *